(12) United States Patent
Vilhonen

(10) Patent No.: US 7,187,230 B2
(45) Date of Patent: Mar. 6, 2007

(54) TRANSFERRED-IMPEDANCE FILTERING IN RF RECEIVERS

(75) Inventor: Sami Vilhonen, Littoinen (FI)

(73) Assignee: Nokia Corporation, Espoo (FI)

( * ) Notice: Subject to any disclaimer, the term of this patent is extended or adjusted under 35 U.S.C. 154(b) by 88 days.

(21) Appl. No.: 11/092,952

(22) Filed: Mar. 18, 2005

(65) Prior Publication Data

US 2006/0208791 A1   Sep. 21, 2006

(51) Int. Cl.
*H03K 5/00* (2006.01)
(52) U.S. Cl. ..................... 327/552; 330/302
(58) Field of Classification Search ........ 327/551–559, 327/355–361; 330/302
See application file for complete search history.

(56) References Cited

U.S. PATENT DOCUMENTS

| 6,133,793 | A  | * | 10/2000 | Lau et al. ................. 330/302 |
| 6,831,497 | B2 | * | 12/2004 | Koh et al. ................. 327/254 |
| 6,937,646 | B1 | * | 8/2005  | McCorkle .................. 375/150 |
| 2002/0183016 | A1 | | 12/2002 | Kemmochi et al. |
| 2004/0239442 | A1 | | 12/2004 | Wilcox |

FOREIGN PATENT DOCUMENTS

JP          404266243   *  9/1992

\* cited by examiner

*Primary Examiner*—Dinh T. Le (57) ABSTRACT

The present invention provides a method for using transferred-impedance filtering in RF (radio frequency) receivers (e.g., inside of a mobile communication device), wherein said filtering can be done with MOS-switches transferring impedance of a regular RC or RCL circuit to RF frequency filtering inside an RFIC (radio frequency integrated circuit).

26 Claims, 7 Drawing Sheets

TRANSFERRED-IMPEDANCE FILTERING IN RF RECEIVERS

TECHNICAL FIELD

This invention generally relates to communication systems, and more specifically to using transferred-impedance filtering in RF receivers.

BACKGROUND ART

The RF receivers must tolerate high blocking signals while maintaining their own performance. This requires filtering for RF-signals prior to a LNA (low noise amplifier) and in many systems also after the LNA. This is especially true in code division multiple access systems (e.g., CDMA2000 and WCDMA) where a transmitter usually sends its high-level signal while a receiver receives a very low-level signal.

At the present time, filtering is done mainly with SAW (surface acoustic wave) or BAW (bulk acoustic wave) filters or resonators. These components are expensive, impossible to integrate with a standard CMOS or BiCMOS process and also require large areas of PWBs (printed wiring boards). Such filters also decrease the possibility for modularity and also increase the number of I/O's (inputs/outputs) in RFIC's (radio frequency integrated circuits) thus increasing their complexity.

DISCLOSURE OF THE INVENTION

The object of the present invention is to provide a novel method for using transferred-impedance filtering in RF (radio frequency) receivers, wherein said filtering can be done with MOS-switches transferring impedance of a regular RC or RCL circuit to RF frequency filtering inside an RFIC (radio frequency integrated circuit).

According to a first aspect of the invention, a method for transferred-impedance filtering in a receiver, comprises the steps of: receiving a radio frequency signal and converting it to an electrical domain; amplifying the radio frequency signal in the electrical domain using an amplifier containing a resistance R, thus generating an amplified RF signal; and filtering the amplified RF signal using a transferred-impedance filter containing at least one capacitor C and having a pass band with a center frequency indicated by a reference frequency, wherein −3 dB frequencies of the pass band are given by the reference frequency plus a corner frequency which depends on the resistor R and the at least one capacitor C and by the reference frequency minus a further corner frequency which also depends on the resistor R and the at least one capacitor C.

According further to the first aspect of the invention, the corner frequency and the further corner frequency may be equal and may be given by $F_{RC}=1/\pi 2RC$. Further, the transferred-impedance filter may also perform a down conversion mixing function such that a low frequency baseband signal may be an output signal of the transferred-impedance filter.

Further according to the first aspect of the invention, the reference frequency may be a local oscillator frequency $F_{LO}$ provided to the transferred-impedance filter.

Still further according to the first aspect of the invention, the filtering may be performed using two transferred-impedance filters in inphase and quadrature branches, respectively, wherein each of two local oscillator signals having the frequency $F_{LO}$ but $\pi/2$ apart in a phase domain may be provided to only one of the two transferred-impedance filters.

According further to the first aspect of the invention, the parasitic capacitances of the transferred-impedance filter are compensated by an inductor in the amplifier such that an absolute value of a reactive component of an amplifier output impedance (for the amplified RF signal) is close to zero and negligible compared to a resistive component of said output impedance.

According still further to the first aspect of the invention, the at least one inductor L may be added in series with the at least one capacitor C and the reference frequency may be given by $F_{LO}-F_{LC}$ or $F_{LO}+F_{LC}$, the $F_{LO}$ being a local oscillator frequency provided to the transferred-impedance filter and the $F_{LC}$ being an LC resonant frequency given by $F_{LC}=1/2\pi\sqrt{LC}$.

According further still to the first aspect of the invention, the at least one inductor L may be added in parallel with the at least one capacitor C and the reference frequency may be given by $F_{LO}-F_{LC}$ or $F_{LO}+F_{LC}$, the $F_{LO}$ being a local oscillator frequency provided to the transferred-impedance filter and the $F_{LC}$ being an LC resonant frequency given by $F_{LC}=1/2\pi\sqrt{LC}$. Still further, the corner frequency and the further corner frequency further may depend on the at least one inductor L.

According yet further still to the first aspect of the invention, the receiver may be a part of a mobile terminal, mobile phone or a mobile communication device.

Yet still further according to the first aspect of the invention, the receiver may be a radio frequency (RF) receiver.

According to a second aspect of the invention, a receiver for transferred-impedance filtering, comprises: an antenna, for receiving a radio frequency signal and converting it to an electrical domain; an amplifier containing a resistance R, for amplifying the radio frequency signal in the electrical domain, thus generating an amplified RF signal; and at least one transferred-impedance filter, for filtering the amplified RF signal, the transferred-impedance filter containing at least one capacitor C and having a pass band with a center frequency indicated by a reference frequency, wherein −3 dB frequencies of the pass band are given by the reference frequency plus a corner frequency which depends on the resistor R and the at least one capacitor C and by the reference frequency minus a further corner frequency which also depends on the resistor R and the at least one capacitor C.

According further to the second aspect of the invention, the parasitic capacitances of the transferred-impedance filter are compensated by an inductor in the amplifier such that an absolute value of a reactive component of an amplifier output impedance (for the amplified RF signal) is close to zero and negligible compared to a resistive component of said output impedance.

Further according to the second aspect of the invention, the reference frequency may be a local oscillator frequency $F_{LO}$ provided to the transferred-impedance filter.

Further still according to the second aspect of the invention, the transferred-impedance filter may also perform a down conversion mixing function such that a low frequency baseband signal may be an output signal of the transferred-impedance filter.

According further to the second aspect of the invention, the parasitic capacitances of the amplifier may be compensated by an inductor such that an absolute value of a reactive component of the amplified RF signal may be close to zero and negligible compared to a resistive component of the amplified RF signal.

According still further to the second aspect of the invention, the at least one inductor L may be added in series with the at least one capacitor C and the reference frequency may be given by $F_{LO}-F_{LC}$ or $F_{LO}+F_{LC}$, the $F_{LO}$ being a local oscillator frequency provided to the transferred-impedance filter and the $F_{LC}$ being an LC resonant frequency given by $F_{LC}=1/\pi 2LC$.

According further still to the second aspect of the invention, the at least one inductor L may be added in parallel with the at least one capacitor C and the reference frequency may be given by $F_{LO}-F_{LC}$ or $F_{LO}+F_{LC}$, the $F_{LO}$ being a local oscillator frequency provided to the transferred-impedance filter and the $F_{LC}$ being an LC resonant frequency given by $F_{LC}=\frac{1}{2}\pi\sqrt{LC}$. Further, the corner frequency and the further corner frequency further may depend on the at least one inductor L.

According yet further still to the second aspect of the invention, the receiver may be a part of a mobile terminal, mobile phone or a mobile communication device.

Yet still further according to the second aspect of the invention, the receiver may be a radio frequency (RF) receiver.

According to a third aspect of the invention, an a communication device, comprises: a receiver, for transferred-impedance filtering, the receiver comprises: an antenna, for receiving a radio frequency signal and converting it to an electrical domain; an amplifier containing a resistance R, for amplifying the radio frequency signal in the electrical domain, thus generating an amplified RF signal; and at least one transferred-impedance filter, for filtering the amplified RF signal, the transferred-impedance filter containing at least one capacitor C and having a pass band with a center frequency indicated by a reference frequency, wherein ba-3 dB frequencies of the pass band are given by the reference frequency plus a corner frequency which depends on the resistor R and the at least one capacitor C and by the reference frequency minus a further corner frequency which also depends on the resistor R and the at least one capacitor C.

The advantages of the present invention include (but are not limited to):

There will be no need for expensive external filtering;

Modularity will be easy to obtain since there is no fixed filtering in the receiver;

Many I/O's will be saved; and

Saving PWB area.

BRIEF DESCRIPTION OF THE DRAWINGS

For a better understanding of the nature and objects of the present invention, reference is made to the following detailed description taken in conjunction with the following drawings, in which.

BEST MODE FOR CARRYING OUT THE INVENTION

The present invention provides a method for using transferred-impedance filtering in RF (radio frequency) receivers (e.g., inside of a mobile communication deice), wherein said filtering can be done with MOS-switches transferring impedance of a regular RC or RCL circuit to RF frequency filtering inside an RFIC (radio frequency integrated circuit).

Figure 1:
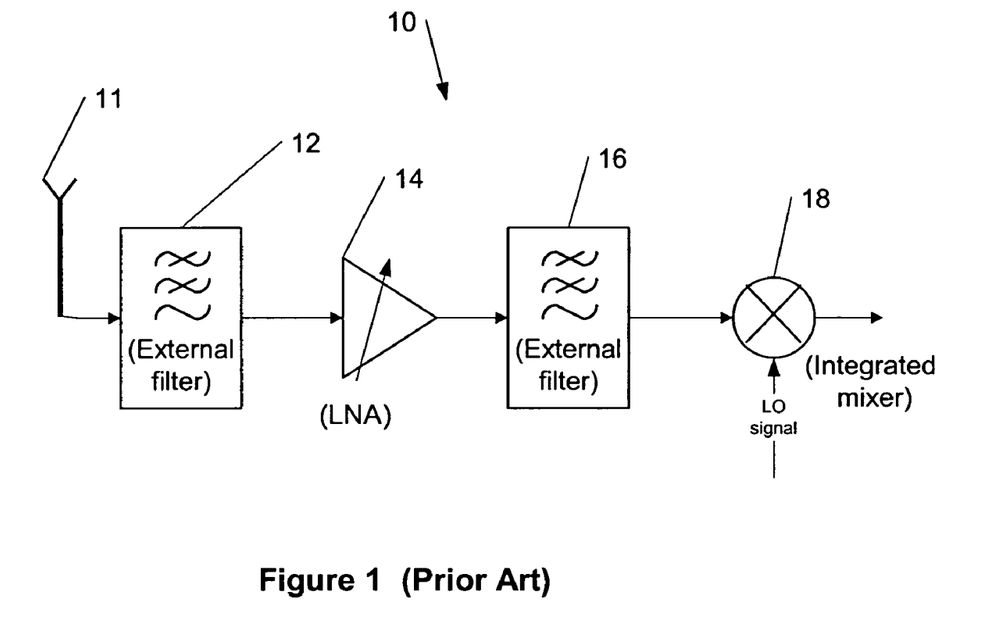
FIG. 1 is a block diagram of a front end of an RF receiver, according to the prior art.

FIG. 1 shows an example of a block diagram of a front end of an RF receiver 10, according to the prior art. An antenna 11 receives a radio frequency signal and converts it to an electrical domain. Then the signal is filtered first using an external filter 12, amplified using a low noise amplifier (LNA) 14 and filtered again using an external filter 16 before it is provided to a mixer 18 as a part of a normal algorithm, according to the prior art.

Figure 2A:
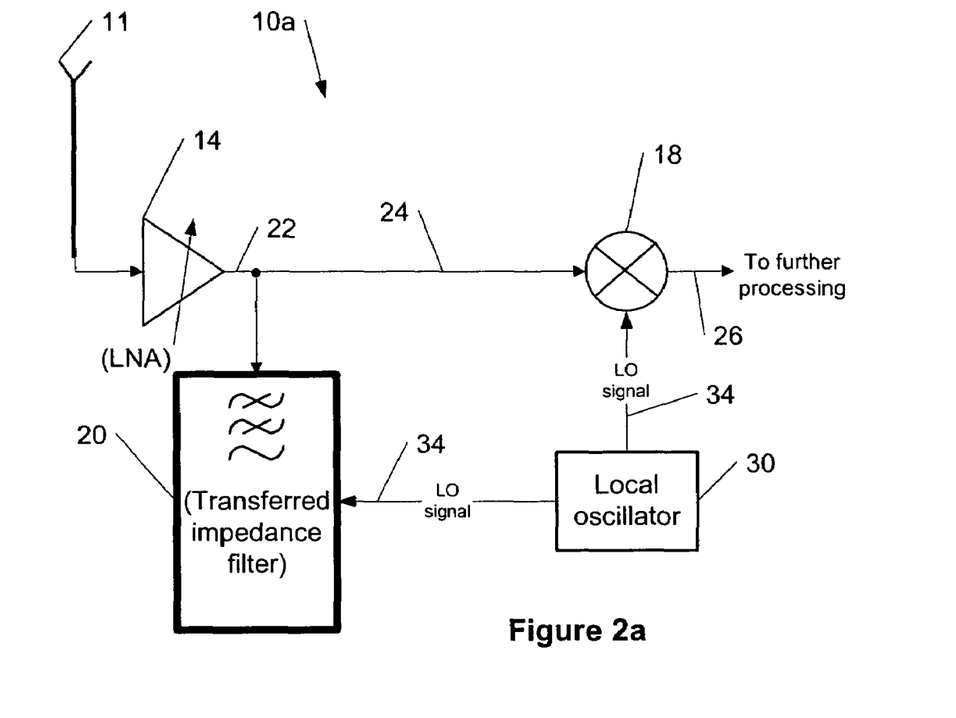
FIGS. 2a and 2b are block diagrams of a front end of an RF receiver, according to the present invention.
Figure 2B:
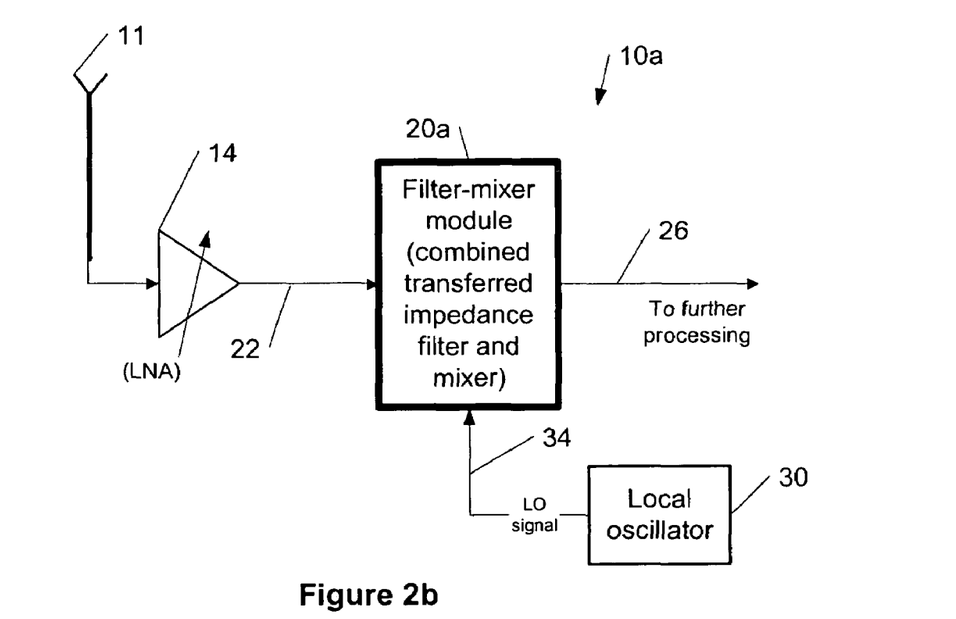

FIGS. 2a and 2b show examples among others of block diagrams of a front end of RF receivers 10a and 10b, respectively, according to the present invention. Compared to the prior art processing shown in FIG. 1, a new transferred-impedance circuitry is used instead of the external filters 12 and 16.

FIG. 2a corresponds to a case where the low noise amplifier (or in general just an amplifier) 14 is connected in parallel with the transferred-impedance filter 20 using an amplified RF signal 22, and the output RF signal 24 is provided to the mixer 18 for a normal further processing. In this scenario a LO (local oscillator) signal 34 with a frequency $F_{LO}$ can be provided to both the transferred-impedance filter 20 and to the mixer 18 by a local oscillator 30.

FIG. 2b demonstrates a further improvement of the present invention wherein the transferred-impedance filter 20 fulfills a function of the mixer 18 and is shown as a filter-mixer module 20a, so its output signal 26 is the same as the output signal of the mixer 18. A more detailed description for implementing blocks 14, 20 and 20a presented in FIGS. 2a and 2b is provided below.

Figure 3A:
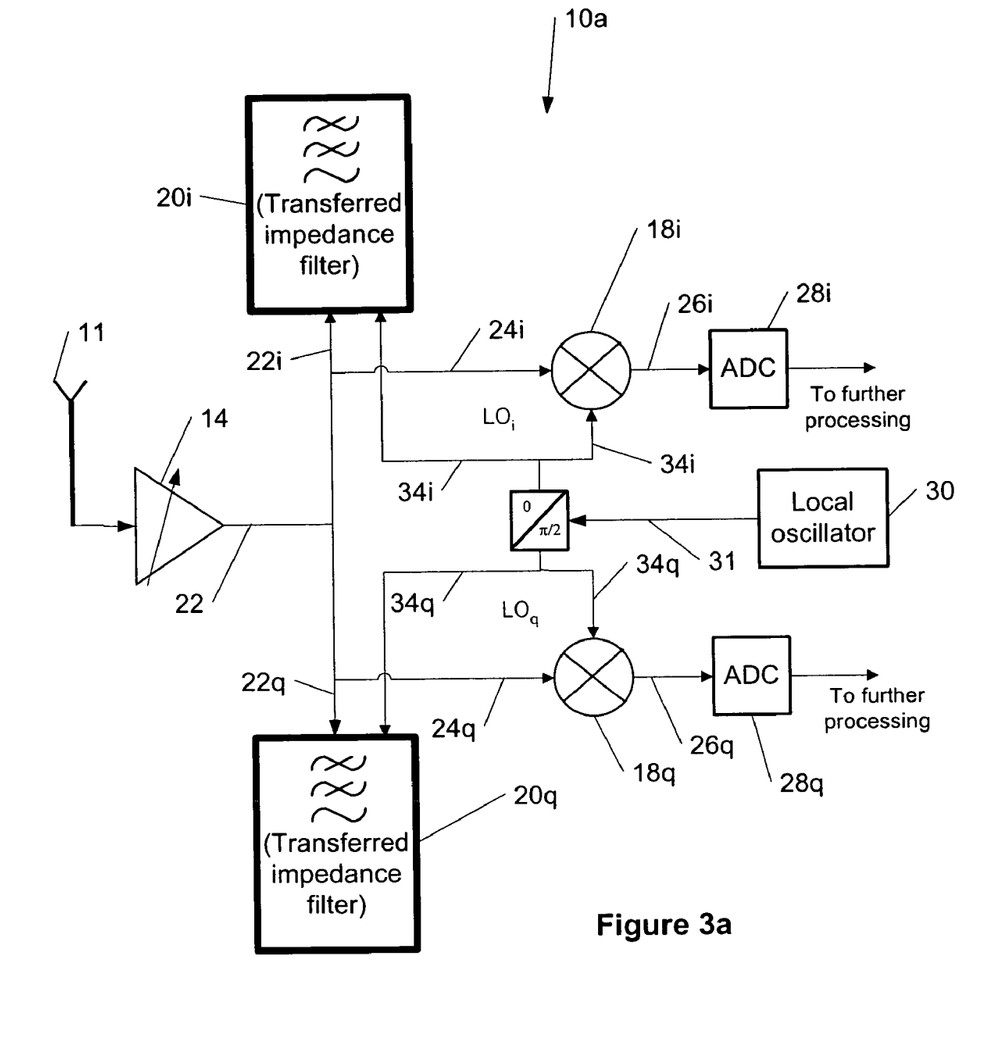
FIGS. 3a and 3b are block diagrams of a front end of an RF receiver showing inphase and quadrature branches, according to the present invention.
Figure 3B:
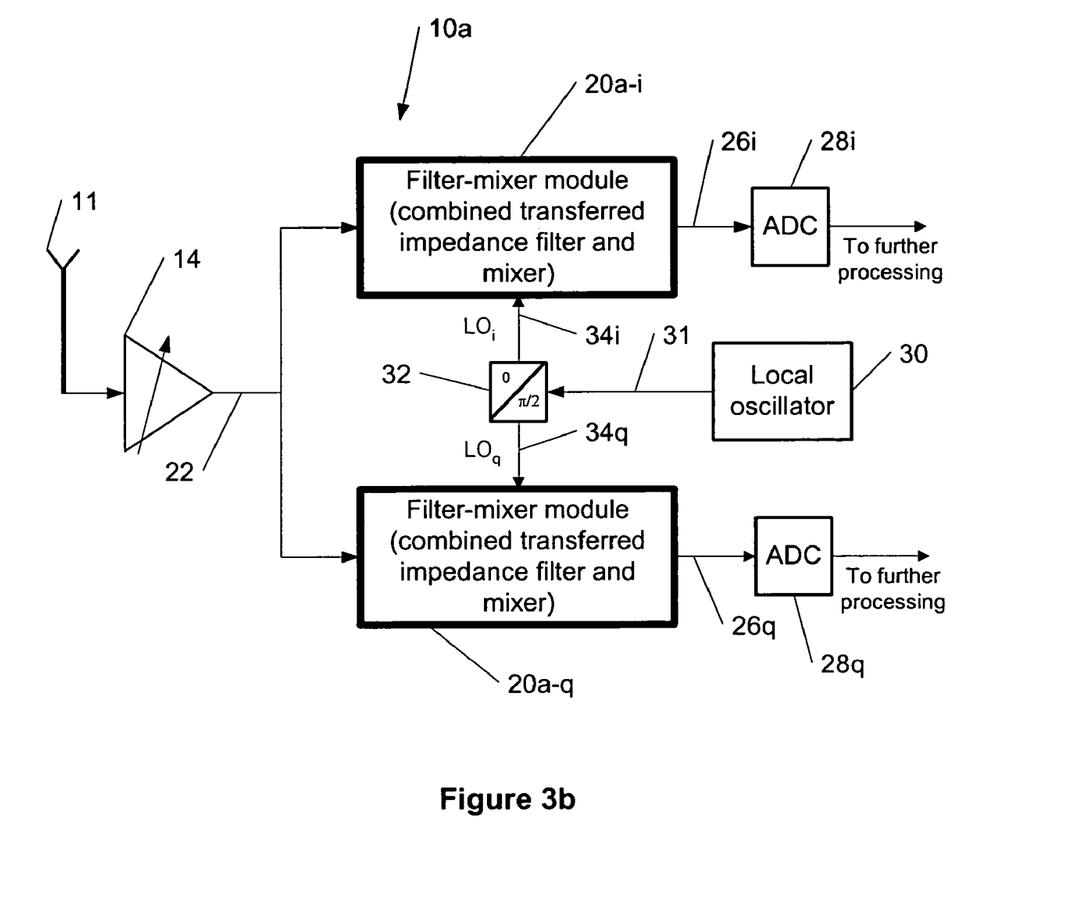

FIGS. 3a and 3b show examples among others of block diagrams of front end receivers 10a and 10b, respectively, showing inphase and quadrature branches, according to the present invention. In FIG. 3a there are two said transferred-impedance filters 20i and 20q for operating in inphase and quadrature branches with inputs (amplified RF signals) 22i and 22q, respectively, wherein two local oscillator (LO) signals 34i and 34q have the frequency $F_{LO}$ but $\pi/2$ apart in a phase domain are provided to the two transferred impedance filters 20a–i and 20a–q, respectively. In order to prevent inphase and quadrature branches interfering with each other, a duty cycle for the LO signals 34i and 34q can be changed from a normally used duty cycle of 50:50 to 25:75, according to the present invention. This can be implemented using appropriate switches (not shown in FIGS. 3a and 3b).

Furthermore, mixers 28i and 28q, in response to output RF signals 24i and 24q, provide output signals 26i and 26q to analog-to-digital converters 28i and 28q, respectively, for further processing. FIG. 3b depicts a similar arrangement but with a filter-mixer module 20a–i instead of the blocks 20i and 28i and with a filter-mixer module 20a–q instead of the blocks 20a–q and 28q, respectively, as described above.

Figure 4:
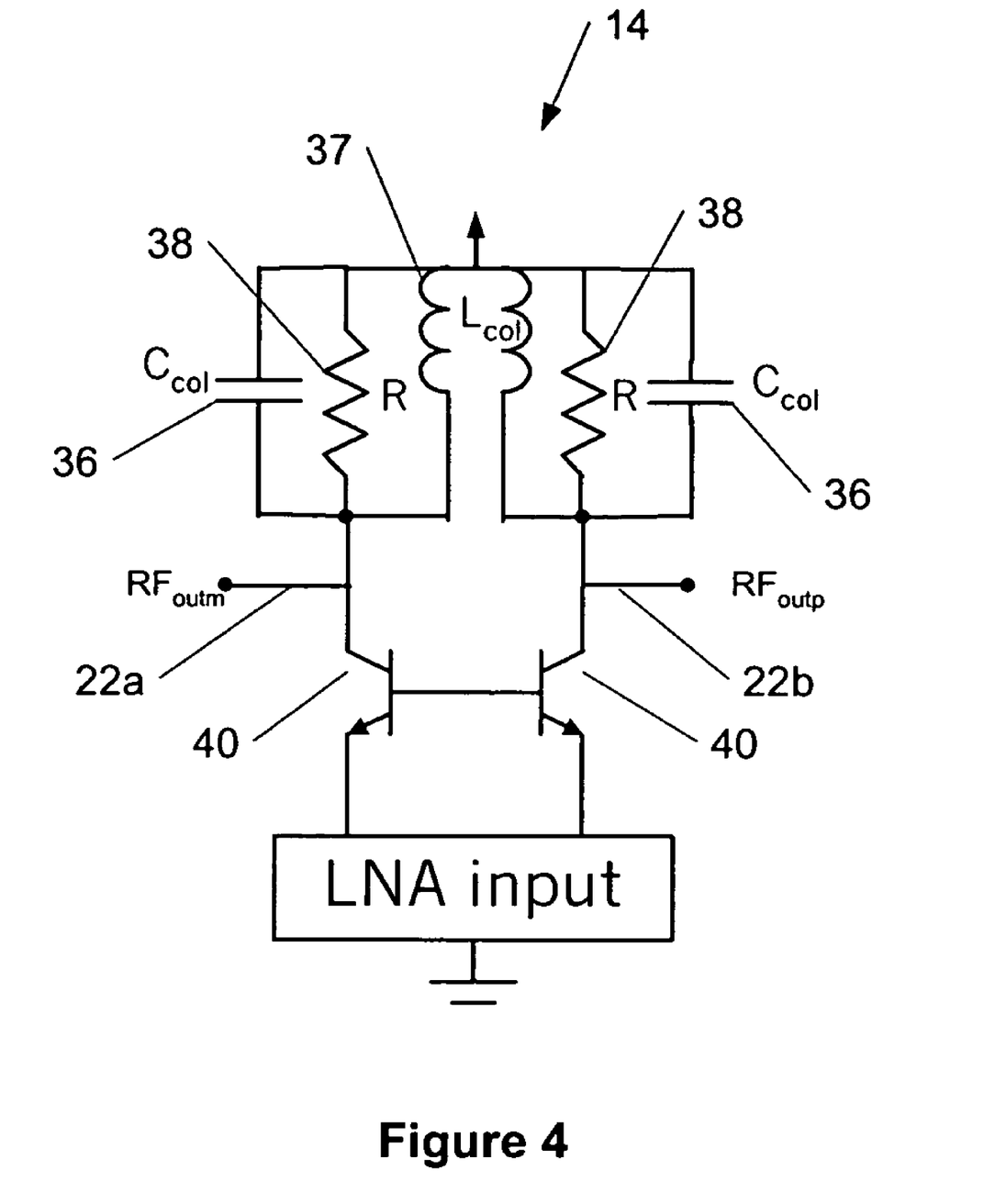
FIG. 4 is a simplified schematic of a low noise amplifier.

FIG. 4 shows an example among others of a simplified schematic of the low noise amplifier (or generally an amplifier) 14 utilizing a differential transistor pair 40. In FIG. 4 the inductors Lcol 37 compensate the capacitive part of the LNA output impedance(i.e., for amplified RF signals 22, 22i or 22q), and said capacitive part includes Ccol 36 and the parasitic capacitance of the transferred-impedance filter 20 (or similarly of the blocks 20i, 20q, 20a, 20a–i and 20a–q). Thus, parasitic capacitances are compensated by the inductor 37 such that an absolute value of a reactive component of the LNA output impedance for the amplified RF signal 22 is close to zero and negligible compared to a resistive component of the LNA output impedance for said amplified RF signal 22 determined by the resistance 38. Consequently, the amplified RF signal which is shown in FIG. 4 as $RF_{outm}$ and $RF_{outp}$ signals 22a and 22b, (which can represent amplified RF signals 22, 22i or 22q as differential signals so these RF signals 22, 22i or 22q can be positive or negative), respectively, is dominated by the resistor R 38.

Figure 5A:
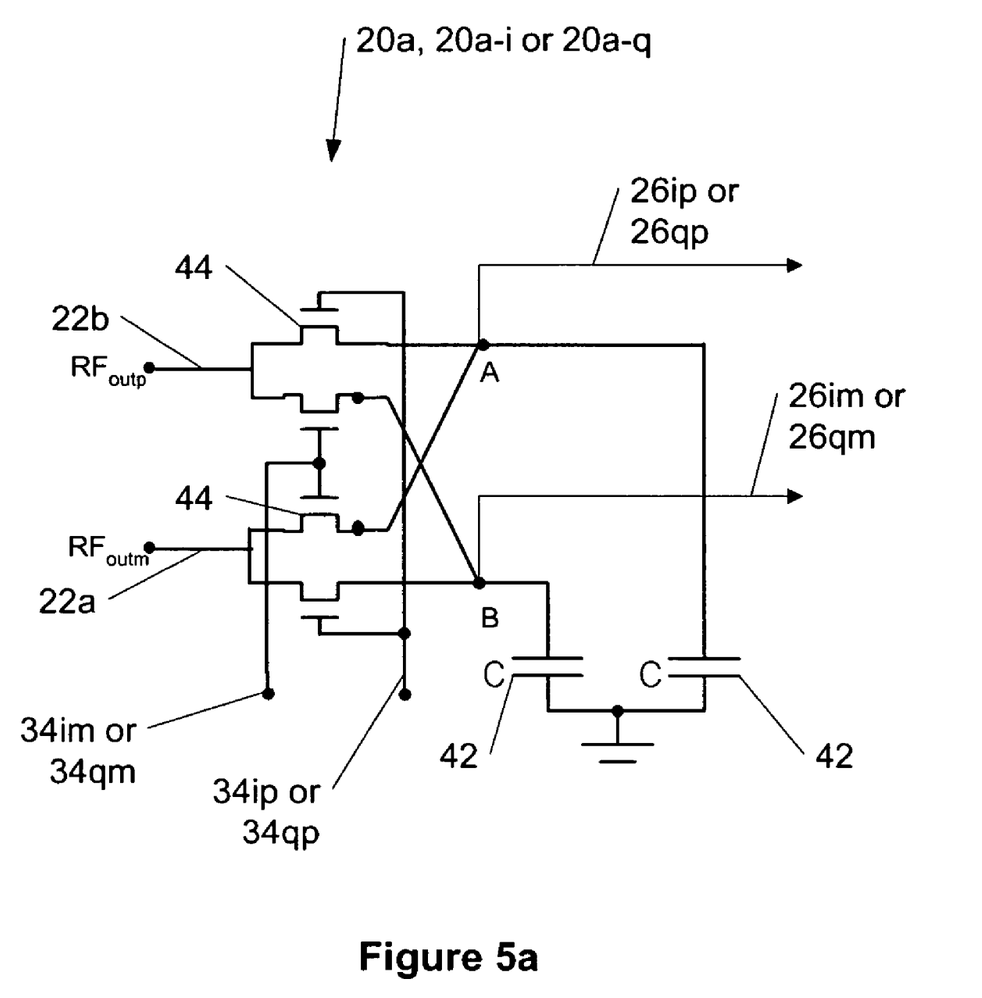
FIGS. 5a, 5b and 5c are simplified schematics of a transferred-impedance filter, according to the present invention.
Figure 5B:
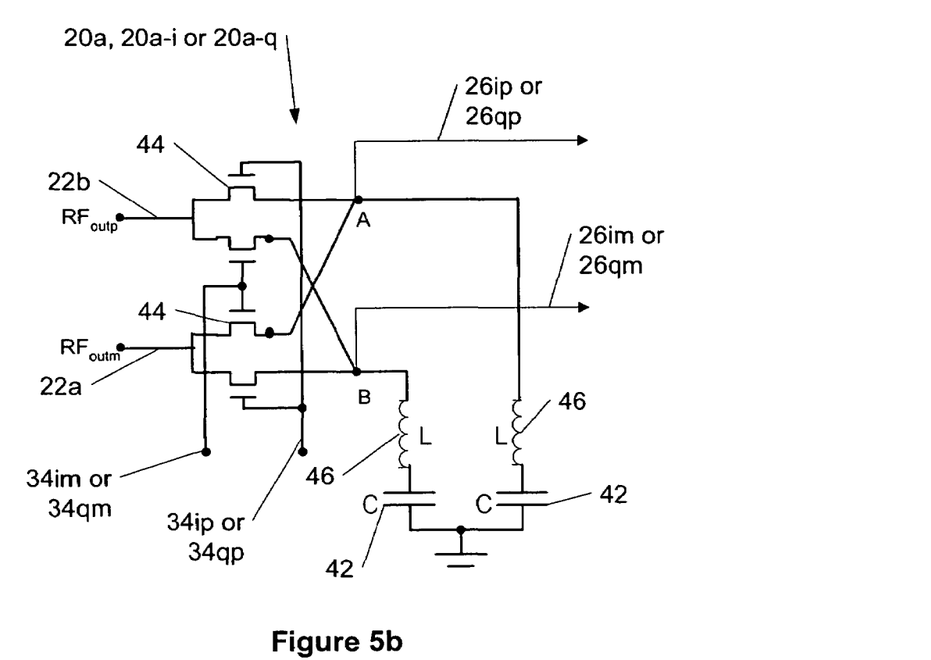
Figure 5C:
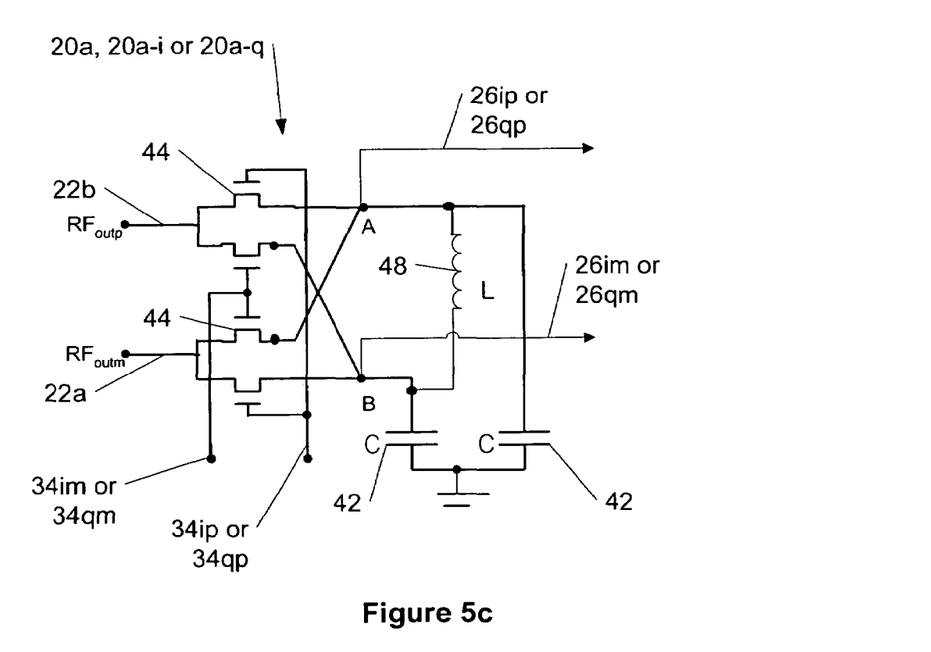

FIGS. 5a, 5b and 5c are examples among others of a simplified schematic of the filter-mixer module 20a (or similarly of modules 20a–i and 20a–q), according to the present invention utilizing MOSFETs (metal-oxide-semiconductor field-effect transistors) 44.

In one embodiment of the present invention shown in FIG. 5a, MOSFETs are being switched with LO (local oscillator) signal between on and off states. Capacitors C 42 are then switched between $RF_{outp}$ and $RF_{outm}$ ports. The transferred-impedance filter 20 is connected at the LNA 14 outputs $RF_{outm}$ and $RF_{outp}$ signals 22a and 22b (these signals can be collector or drain signals) shown in FIG. 4.

If the incoming RF signal (e.g., amplified RF signals 22, 22i or 22q) differs from the frequency of the LO signal 34, then the capacitors C 42 will be charged with a signal which frequency is the difference of the RF and LO signals. The driving impedance is the impedance of the LNA output, which is the resistor R 38. Therefore we get impedance filtering at the frequency $F_{LO}+F_{RC}$, where $F_{LO}$ is the LO-signal frequency and $F_{RC}$ is the corner frequency of the resistor R 38 and the capacitor C 42 (i.e., $\frac{1}{2\pi RC}$).

This means that we get a band pass filter at the LNA 14 output with pass band corner frequencies (also called –3 dB frequencies or half-power frequencies) $F_{LO}+F_{RC}$ and $F_{LO}-F_{RC}$, respectively. This band pass filter then follows the LO-signal and there is enough attenuation for adjacent channels, blockers and for a transmitter (connected to the antenna 11 but not shown in FIG. 2a or 2b).

The shape of this filter is also very steep, since the attenuation increases as a function of the RC constant corresponding to low frequencies. This is easier to explain with an example. If the LO frequency is 2 GHz and an RC time constant is equivalent to 2 MHz, then the signal of frequency 2.002 GHz attenuates 3 dB. If we had a standard RC–3 dB point at that frequency, 20 dm attenuation would be reached at the frequency of 20.002 GHz (i.e., one decade away). With the filter mixer module 20a(similarly for modules 20a–i or 20a–q), the 20 dB attenuation will be reached at 2.022 GHz (i.e., one decade away from the RC frequency 2 MHz). Thus the low frequency (defined by the RC constant) is transferred to the RF frequencies. This is a significant improvement over the possible prior art solutions.

It is noted that other impedances can be transferred to higher frequency filtering using the methodology described in the present invention. The capacitors 42 in FIG. 5a can be replaced with an LC-resonator. This is especially important in CDMA2000 handsets which must tolerate high blocker only 900 kHz away from its own LO-frequency. FIGS. 5b and 5c demonstrate LC resonator options.

According to the present invention, as shown in FIG. 5b, inductors L 46 are added in series with the capacitors C 42 (compared to FIG. 5a) and the center frequency of the pass band filter (or a reference frequency) is given by $F_{LO}-F_{LC}$ or $F_{LO+FLC}$, wherein FLC is the local oscillator frequency provided to said transferred-impedance filter 20a(or similarly to blocks 20a–i or 20a–q) by the local oscillator 30 and $F_{LC}$ is an LC resonant frequency given by $F_{LC}=\frac{1}{2\pi\sqrt{LC}}$. $F_{LC}$ can be made as low as 900 kHz. Then the resultant center frequency of the pass band filter could be $F_{LO}$ –900 kHZ or $F_{LO}$900 kHz (e.g., this can be important in CDMA2000). Thus, if the inductors L 46 and the capacitors C 42 are in series, there is a notch at the output of the LNA 14 which is very close to the RE frequency of the received signal.

Moreover, according to the present invention, as shown in FIG. 5c, an inductor L 48 is added in parallel with the capacitors C 42 (compared to FIG. 5a) with an LC resonant frequency $F_{LC}$ given by $F_{LC}=\frac{1}{2\pi\sqrt{LC}}$. It is noted that for the resonant curve with the center frequencies $F_{LO}+F_{LC}$ and $F_{LO}-F_{LC}$, the corner frequencies (–3 dB frequencies) of the pass band depends on the inductor L 48 (in addition to being a function of the resistor R 38 and the capacitors C 42). Thus, if the inductor L 48 and the capacitor C 42 are in parallel, then there are narrow pass bands around the resonant frequency at $F_{LO}+F_{LC}$ and $F_{LO}-F_{LC}$ where $F_{LC}=\frac{1}{2\pi\sqrt{LC}}$.

Inductors 46 or 48 can be generated, e.g., from capacitors with operational amplifiers (which imitate inductors) or by making a second (or higher) order filter by generating an impedance with a magnitude degrading as a second order filter response thus providing a low area, high performance filter systems.

There are a lot of variations of the present invention. It is noted that, according to the present invention, NMOS switches, typically used in schematics presented in FIGS. 5a, 5b and 5c, can be of other types. Moreover, the transferred-impedance filter does not necessarily have to be connected to the output of the amplifier 14. Also, it is clearly understood that the technology described in the invention can provide a broad range of LC resonant frequencies and impedances transferred to filtering of radio frequencies, according to the present invention. Furthermore, the examples presented in FIGS. 4, 5a, 5b and 5c above utilize differential (i.e., both positive and negative) signals but the method of the present invention can be also used in single-ended systems with only one signal line.

It is to be understood that the above-described arrangements are only illustrative of the application of the principles of the present invention. Numerous modifications and alternative arrangements may be devised by those skilled in the art without departing from the scope of the present invention, and the appended claims are intended to cover such modifications and arrangements.

What is claimed is:

1. A method comprising:
    receiving a radio frequency signal and converting it to an electrical signal by an antenna of a receiver;
    amplifying said electrical signal using an amplifier containing a resistance R, for generating an amplified RF signal; and
    filtering said amplified RF signal in response to a reference signal comprising a reference frequency and using at least one transferred-impedance filter containing at least one capacitor C and having a pass band with a center frequency equal to said reference frequency, wherein –3 dB frequencies of said pass band are given by said reference frequency plus a corner frequency which depends on said resistor R and said at least one capacitor C and by said reference frequency minus a further corner frequency which also depends on said resistor R and said at least one capacitor C.

2. The method of claim 1, wherein said corner frequency and said further corner frequency are equal and given by $F_{RC}=1/\pi RC$.

3. The method of claim 2, wherein said at least one transferred-impedance filter also performs a down conversion mixing function such that a low frequency baseband signal is an output signal of said transferred-impedance filter.

4. The method of claim 1, wherein said reference frequency is a local oscillator frequency $F_{LO}$ provided to said transferred-impedance filter.

5. The method of claim 1, wherein said filtering is performed using two transferred-impedance filters of said at least one transferred-impedance filter, in inphase and quadrature branches respectively, wherein each of two local oscillator signals having said frequency $F_{LO}$ but $\pi/2$ apart in a phase domain is provided to only one of said two transferred-impedance filters.

6. The method of claim 1, wherein parasitic capacitances of said transferred-impedance filter are compensated by an inductor in the amplifier such that an absolute value of a reactive component of an amplifier output impedance is close to zero and negligible compared to a resistive component of said amplifier output impedance.

7. The method of claim 1, wherein at least one inductor L is added in series with said at least one capacitor C and said reference frequency is given by $F_{LO}-F_{LC}$ or $F_{LO}+F_{LC}$, said $F_{LO}$ being a local oscillator frequency provided to said transferred-impedance filter and said $F_{LC}$ being an LC resonant frequency given by $F_{LC}=1/2\pi\sqrt{LC}$.

8. The method of claim 1, wherein at least one inductor L is added in parallel with said at least one capacitor C and said reference frequency is given by $F_{LO}-F_{LC}$ or $F_{LO}=F_{LC}$, said $F_{LO}$ being a local oscillator frequency provided to said transferred-impedance filter and said $F_{LC}$ being an LC resonant frequency given by $F_{LC}=1/2\pi\sqrt{LC}$.

9. The method of claim 8, wherein said corner frequency and said further corner frequency further depend on said at least one inductor L.

10. The method of claim 1, wherein said receiver is a part of a mobile terminal, mobile phone or a mobile communication device.

11. The method of claim 1, wherein said receiver is a radio frequency receiver.

12. A receiver comprising:
an antenna, for receiving a radio frequency signal and converting it to an electrical signal;
an amplifier containing a resistance R, for amplifying said electrical signal, for generating an amplified RF signal; and
at least one transferred-impedance filter, for filtering said amplified RF signal in response to a reference signal comprising a reference frequency said, transferred-impedance filter containing at least one capacitor C and having a pass band with a center frequency equal to said reference frequency, wherein −3 dB frequencies of said pass band are given by said reference frequency plus a corner frequency which depends on said resistor R and said at least one capacitor C and by said reference frequency minus a further corner frequency which also depends on said resistor R and said at least one capacitor C.

13. The receiver of claim 12, wherein said corner frequency and said further corner frequency are equal and given by $F_{RC}=1/\pi 2RC$.

14. The receiver of claim 13, wherein said receiver contains two transferred-impedance filters of said at least one transferred-impedance filter, in inphase and quadrature branches respectively, wherein each of two local oscillator signals having said frequency $F_{LO}$ but $\pi/2$ apart in a phase domain is provided to only one of said two transferred-impedance filters.

15. The receiver of claim 12, wherein said reference frequency is a local oscillator frequency FLO provided to said transferred-impedance filter.

16. The method of claim 12, wherein said at least one transferred-impedance filter also performs a down conversion mixing function such that a low frequency baseband signal is an output signal of said transferred-impedance filter.

17. The receiver of claim 12, wherein parasitic capacitances of said transferred-impedance filter are compensated by an inductor in the amplifier such that an absolute value of a reactive component of an amplifier output impedance is close to zero and negligible compared to a resistive component of said amplifier output impedance.

18. The receiver of claim 12, wherein at least one inductor L is added in series with said at least one capacitor C and said reference frequency is given by $F_{LO}-F_{LC}$ or $F_{LO}+F_{LC}$, said $F_{LO}$ being a local oscillator frequency provided to said transferred-impedance filter and said $F_{LC}$ being an LC resonant frequency given by $F_{LC}+1/\pi 2LC$.

19. The receiver of claim 12, wherein at least one inductor L is added in parallel with said at least one capacitor C and said reference frequency is given by $F_{LO}-F_{LC}$ or $F_{LO}+F_{LC}$, said $F_{LO}$ being a local oscillator frequency provided to said transferred-impedance filter and said $F_{LC}$ being an LC resonant frequency given by $F_{LC}=1/2\sqrt{LC}$.

20. The receiver of claim 19, wherein said corner frequency and said further corner frequency further depend on said at least one inductor L.

21. The receiver of claim 12, wherein said receiver is a part of a mobile terminal, mobile phone or a mobile communication device.

22. The receiver of claim 12, wherein said receiver is a radio frequency receiver.

23. A communication device, comprising:
a receiver, for transferred-impedance filtering, said receiver comprises:
an antenna, for receiving a radio frequency signal and converting it to an electrical signal;
an amplifier containing a resistance R, for amplifying said electrical signal, for generating an amplified RF signal; and
at least one transferred-impedance filter, for filtering said amplified RF signal in response to a reference signal comprising a reference frequency, said transferred-impedance filter containing at least one capacitor C and having a pass band with a center frequency equal to said reference frequency, wherein ba−3 dB frequencies of said pass band are given by said reference frequency plus a corner frequency which depends on said resistor R and said at least one capacitor C and by said reference frequency minus a further corner frequency which also depends on said resistor R and said at least one capacitor C.

24. The communication device of claim 23, wherein said corner frequency and said further corner frequency are equal and given by $F_{RC}=1/\pi 2RC$.

25. A receiver, comprising:
- means for receiving a radio frequency signal and converting it to an electrical signal;
- amplifying means containing a resistance R, for amplifying said electrical signal, for generating an amplified RF signal; and
- at least one filtering means, for filtering said amplified RF signal in response to a reference signal comprising a reference frequency, said at least on filtering means containing at least one capacitor C and having a pass band with a center frequency equal to said reference frequency, wherein −3 dB frequencies of said pass band are given by said reference frequency plus a corner frequency which depends on said resistor R and said at least one capacitor C and by said reference frequency minus a further corner frequency which also depends on said resistor R and said at least one capacitor C.

26. The receiver of claim 25, wherein said means for receiving is an antenna and said at least one filtering means is at least one transferred-impedance filter.

* * * * *

UNITED STATES PATENT AND TRADEMARK OFFICE
CERTIFICATE OF CORRECTION

PATENT NO. : 7,187,230 B2
APPLICATION NO. : 11/092952
DATED : March 6, 2007
INVENTOR(S) : Sami Vilhonen Page 1 of 1

It is certified that error appears in the above-identified patent and that said Letters Patent is hereby corrected as shown below:

In column 7, line 7, claim 2, line 3 "1/πRC" should be -- 1/π2RC --.

In column 7, line 37, claim 8, line 3 "=" should be --+--.

In column 7, line 58, claim 12, line 9 after "frequency" -- , -- should be inserted.

In column 7, line 58, claim 12, line 9 "," after "said" should be deleted.

In column 8, line 30, claim 18, line 6 "+" should be -- = --.

In column 8, line 36, claim 19, line 6 "$1/2\sqrt{LC}$" should be -- $1/2\pi\sqrt{LC}$ --.

In column 9, line 9, claim 25, line 9 "on" should be --one--.

Signed and Sealed this

Thirty-first Day of July, 2007

JON W. DUDAS
*Director of the United States Patent and Trademark Office*